United States Patent
You (10) Patent No.: US 6,800,540 B1
(45) Date of Patent: Oct. 5, 2004

(54) METHOD FOR CRYSTALLIZING SILICON (75) Inventor: JaeSung You, Seoul (KR)

(73) Assignee: LG.Philips LCD Co., Ltd., Seoul (KR)

(*) Notice: Subject to any disclaimer, the term of this patent is extended or adjusted under 35 U.S.C. 154(b) by 0 days.

(21) Appl. No.: 10/658,400

(22) Filed: Sep. 10, 2003

(30) Foreign Application Priority Data

Jun. 12, 2003 (KR) .................................. 10-2003-0037739

(51) Int. Cl.[7] .......................... H01L 21/20; G06F 17/50; G03F 9/00
(52) U.S. Cl. ...................... 438/486; 438/662; 438/155; 438/166; 438/795; 438/487; 438/482; 257/E21.134; 257/797; 257/71; 257/72; 257/E21.413; 716/19; 716/20; 43/5; 43/22
(58) Field of Search .................. 438/486, 487, 438/151, 166, 155, 795, 482, 662; 257/E21.134, E21.413, 71, 72, 797, 88; 716/19, 20; 430/5, 22

(56) References Cited

U.S. PATENT DOCUMENTS

| | | | | |
|---|---|---|---|---|
| 2002/0179001 A1 | * | 12/2002 | Jung | .................................. 117/4 |
| 2002/0179004 A1 | * | 12/2002 | Jung | .................................. 117/43 |
| 2002/0197759 A1 | * | 12/2002 | Yang | .................................. 438/48 |
| 2003/0088848 A1 | * | 5/2003 | Crowder | ........................ 716/19 |
| 2004/0053450 A1 | * | 3/2004 | Sposili et al. | ................ 438/151 |

* cited by examiner

Primary Examiner—Matthew Smith
Assistant Examiner—Igwe U. Anya
(74) Attorney, Agent, or Firm—McKenna Long & Aldridge LLP (57) ABSTRACT Disclosed is a method for crystallizing amorphous silicon, in which a substrate on which an amorphous silicon layer is formed is first prepared, and then a mask is disposed above the substrate. The mask is divided into first and second blocks, the first block having a plurality of first transmission slits and a plurality of interception portions formed between the first transmission slits, the second block having a plurality of second transmission slits alternately arranged with the first transmission slits and a plurality of third transmission slits formed corresponding to middle portions of the first transmission slits. Afterwards, first crystalline regions are formed on the amorphous silicon layer by irradiating a laser beam through the first transmission slits. Finally, non-crystalline regions between the first crystalline regions are crystallized and the nucleation regions are re-crystallized by moving either or both of the substrate and the mask by a predetermined distance and by irradiating a laser beam through the second and third transmission slits.

29 Claims, 9 Drawing Sheets

METHOD FOR CRYSTALLIZING SILICON

This application claims the benefit of Korean Patent Application No. 2003-37739, filed on Jun. 12, 2003, which is hereby incorporated by reference for all purposes as if fully set forth herein.

BACKGROUND OF THE INVENTION

1. Field of the Invention

The present invention relates to a method for crystallizing amorphous silicon, and more particularly, to a method for crystallizing amorphous silicon using a sequential lateral solidification (SLS) process.

2. Discussion of the Related Art

Recently, as modem society moves quickly toward an information-oriented society, flat panel displays, which have many advantages such as slimness, lightweight, low power consumption and the like, are widely used. In particular, among the flat panel displays, liquid crystal displays (LCDs), which have a superior color reproduction, have been actively developed.

Generally, an LCD includes two substrates facing each other. Electrodes are formed on the facing surfaces of the two substrates, and a liquid crystal material is injected into a space defined between the two substrates. The liquid crystal display (LCD) controls light transmissibility using electric fields applied between the electrodes to display an image corresponding to video signals.

The lower substrate of the LCD includes thin film transistors. The active layer of the thin film transistors is generally formed of amorphous silicon (a-Si:H). As the amorphous silicon can be deposited as a thin film at a relatively low temperature, it is widely used for forming a switching device of liquid crystal panels. The substrate may be made of a glass having a relatively low-melting point. However, the amorphous silicon thin film has a problem in that it harms the electrical characteristics and reliability of the switching device of the liquid crystal panels, and causes difficulty when increasing the screen size of the LCD.

As large-size and high-definition laptop computers and wall-mountable LCD TVs integrated with image driver circuits are commercialized, pixel-driving devices are required to have improved characteristics, such as a high electric field effect mobility (30 $cm^2/VS$), a high frequency performance characteristic, and a low leakage current. To improve the characteristics, a high quality poly-crystalline silicon is required. The electrical characteristics of the poly-crystalline silicon thin film particularly depend on the size of grains. That is, the greater the size of the grains, the higher the electric field effect mobility.

Accordingly, a method for single-crystallizing silicon has become a major issue in the art. PCT Publication No. WO 97/45827 and Korean Published Patent No. 2001-004129 disclose a sequential lateral solidification (SLS) technique for making a massive single crystalline silicon structure by inducing lateral growth of a silicon crystal using a laser as an energy source. The SLS technique has been developed based on the fact that silicon grains grow in a direction normal to the boundary surface between liquid silicon and solid silicon. SLS techniques crystallizes an amorphous silicon thin film by making silicon grains grow laterally to a predetermined length, by appropriately adjusting energy intensity and beam projection range of a laser. Such a method for crystallizing amorphous silicon using the SLS technique will be described hereinafter in conjunction with the accompanying drawings.

Figure 1:
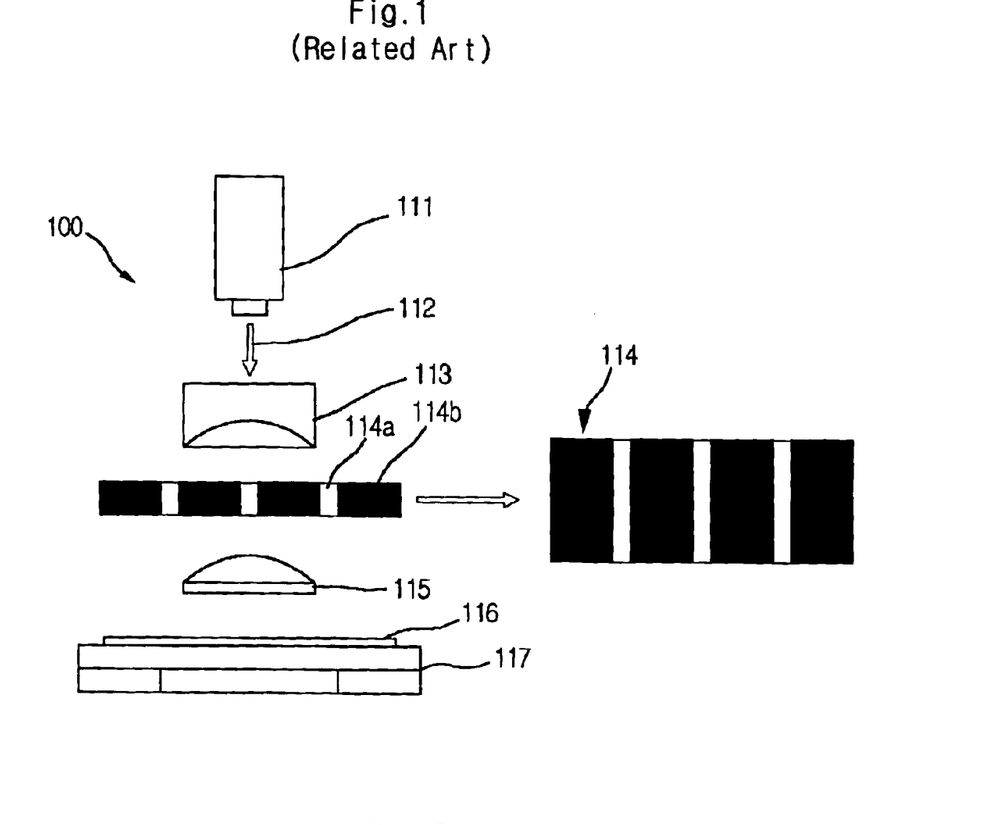
FIG. 1 is a schematic view of an apparatus used for crystallizing amorphous silicon using a SLS technique according to a related art.

FIG. 1 shows an SLS apparatus used for a crystallizing method using the SLS technique. A SLS apparatus 100 includes a laser generator 111 for generating a laser beam 112, a convergence lens 113 for converging the laser beam 112 irradiated from the laser generator 111, a mask 114 for dividing the laser beam into a plurality of sections and projecting the divided sections on a substrate 116, and a scale lens 115 for reducing the laser beam 112 passing through the mask 114 to a predetermined scale.

The laser generator 111 emits the laser beam 112, and the intensity of the emitted laser beam 112 is adjusted while passing through an attenuator (not shown). The laser beam 112 is then directed onto the mask 114 through the convergence lens 113. The substrate 116 having an amorphous silicon layer deposited on its surface is disposed on an X-Y stage 117, corresponding to the mask 114. At this point, in order to crystallize the entire area of the substrate 116, a method for gradually enlarging the crystallized area by minutely moving the X-Y stage 117 is used. The mask 114 is divided into laser beam transmission regions 114a allowing for the transmission of the laser beam 112, and laser beam interception regions 114b for absorbing the laser beam 112. The distance between the transmission regions 114a (the width of each interception region 114) determines length of grains laterally grown.

A method for crystallizing amorphous silicon using the above-described SLS apparatus will be described hereinafter. Generally, crystalline silicon is used for forming a buffer (insulating) layer (not shown) on the substrate 116, and amorphous silicon is deposited on the buffer layer. The amorphous silicon layer is deposited on the substrate 116 using, for example, a chemical vapor deposition (CVD) process, during which a large amount of hydrogen can be retained in the amorphous silicon layer. Since the hydrogen retained in the amorphous silicon tends to separate from the thin film in the presence of heat, a heat treatment is followed for a dehydrogenization process. That is, if the hydrogen is not removed in advance, the crystallized layer may be exfoliated due to the rapid volume expansion of the hydrogen gas retained in the amorphous silicon layer in the course of the crystallization process.

When performing the SLS crystallization, it is difficult to crystallize the entire area of the surface at once. That is, since a width of the laser beam 112 and a size of the mask 114 are limited, the single mask 114 should be realigned many times, and the crystallization process should be repeated whenever the mask 114 is realigned, to crystallize a large-sized screen panel. At this point, it should be understood that an area that is crystallized, which is as large as the area of the single mask 114, is a unit block, and that the crystallization of the unit block should be realized by repeatedly irradiating with the laser beam.

Figure 2:
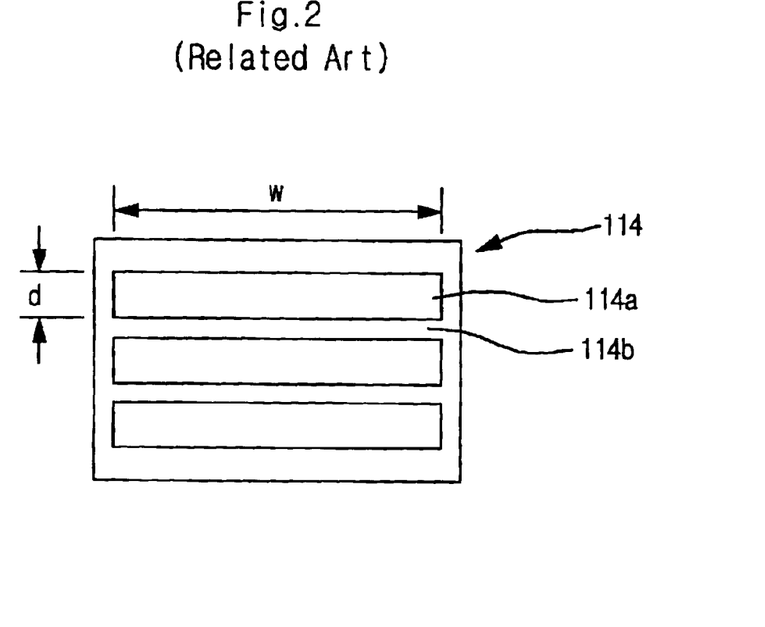
FIG. 2 is a schematic plane view of a mask for crystallizing amorphous silicon using the related art SLS technique.

FIG. 2 shows a schematic plane view illustrating a mask used for the SLS technique. As shown in the drawing, a mask 114 comprises patterned transmission and interception regions 114a and 114b. Each of the transmission regions 114a is defined by a longitudinal slit extending in a first direction. At this point, a width of the transmission region 114a should be less than or equal to twice as long as a maximum length of the grain grown by a first laser irradiated process. When the first beam is directed onto the mask structure as in the above, grains grow laterally in the melted regions of the amorphous silicon layer, which correspond to the transmission regions of the mask. In particular, the grains grow laterally from the both boundaries of the melted region until they contact each other at a middle line of the melted region.

In the course of the crystallization process, the laser beam pattern after passing through the mask 114 and being reduced by the scale lens 115 (see FIG. 1) moves in a direction of an X-axis. At this point, the crystallization process proceeds while the laser beam pattern moves from hundreds of μm to several mm (i.e., length of the pattern reduced by the scale lens 115) in the X-axis direction.

Figure 3A:
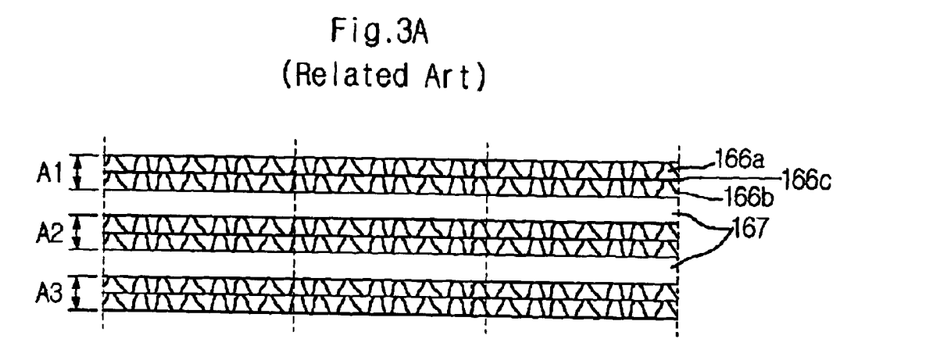
FIGS. 3A to 3C are views illustrating a method for crystallizing amorphous silicon using the related art SLS process.
Figure 3B:
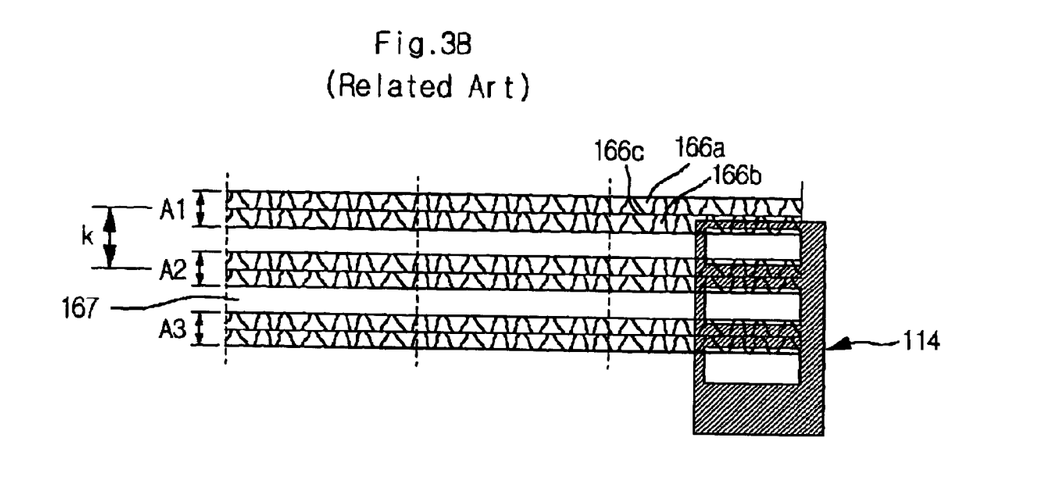
Figure 3C:
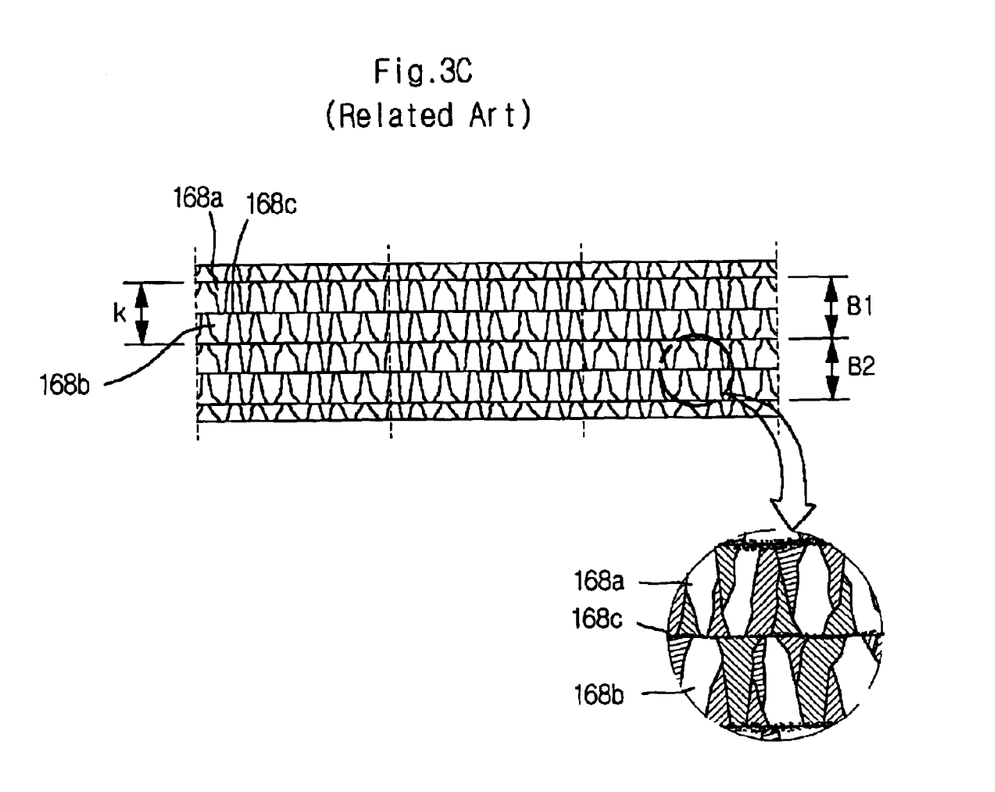

The crystallization method using an SLS technique will be described in more detail hereinafter with reference to FIGS. 3A to 3C, which illustrate an example of a two-shot SLS poly-silicon crystallization method. In this example, three transmission patterns (regions) are defined on the mask.

In the two-shot poly-silicon crystallization method, the regions of the amorphous silicon layer that correspond to the transmission regions are crystallized by irradiating the laser beam twice. In addition, this crystallization process is consecutively carried out in a lengthwise direction. When the crystallization is completed in the lengthwise direction of the substrate, the laser beam pattern moves minutely in a widthwise direction, and then moves lengthwise to proceed with the crystallization, thereby completing the crystallization process for a desired region.

In more detail, the mask 114 (see FIG. 2) is first located corresponding to the substrate, and a first laser beam is used to proceed with the crystallization process for the amorphous silicon layer deposited on the transparent insulating substrate. At this point, the laser beam is divided into a plurality of sections while passing through the plurality of slits 114a (see FIG. 2) formed on the mask 114. Regions of the amorphous silicon layer, which correspond to the slits 114a, are liquefied by the divided sections of the first laser beams. In this case, laser energy intensity is set to a complete melting regime in which the amorphous silicon layer completely melts. When the laser beam irradiation is completed, silicon grains are laterally grown at a boundary between the solid amorphous silicon region and the liquefied amorphous silicon region.

At this point, a width of the beam pattern passing through the mask is set to be less than or equal to twice the length of the grain grown. In addition, the crystallized regions correspond to the transmissive regions 114a (see FIG. 2) of the mask. Therefore, each of the crystallized regions A1, A2, and A3 has a length identical to that of each of the transmissive regions 114a. The regions of the amorphous silicon layer, which correspond to the interception regions 114b (see FIG. 2) of the mask, remain as amorphous silicon regions 167. In the crystallized regions A1, A2, and A3, the grains 166a and 166b are laterally grown from the boundaries between the liquefied silicon and the solid silicon, thereby defining a grain boundary as shown in FIGS. 3A to 3C.

Afterwards, the crystallization process is consecutively carried out in a direction of the X-axis while the stage on which the substrate is disposed moves from hundreds of μm to several mm, which is the same as a length of the mask pattern (beam pattern). As shown in FIG. 3B, when the crystallization in the X-axis direction is completed, the mask 114 or the X-Y stage 117 (see FIG. 2) moves minutely in the direction of a Y-axis.

Next, a second laser irradiation initiates when the first crystallization is finished in the direction of the X-axis. Through the second laser irradiation, the grains of the crystallized silicon formed by the first laser irradiation are further consecutively grown. That is, the grains are further grown to have a length that is half as long as a distance "k", which is the distance between the grain boundary 116c of the crystallized region A1 and the grain boundary of the adjacent crystallized region A2. Accordingly, as shown in FIG. 3C, a poly-silicon thin film formed of the grains 168a and 168b having a predetermined length can be realized. At this point, in newly crystallized regions B1 and B2, the grains 168a and 168b are vertically grown from the boundaries between the liquefied silicon and the solid silicon. The grains 168a and 168b are further grown until they contact each other, thereby defining a new grain boundary 168c. FIG. 3 shows an enlarged view of such grains and boundary.

Figure 4:
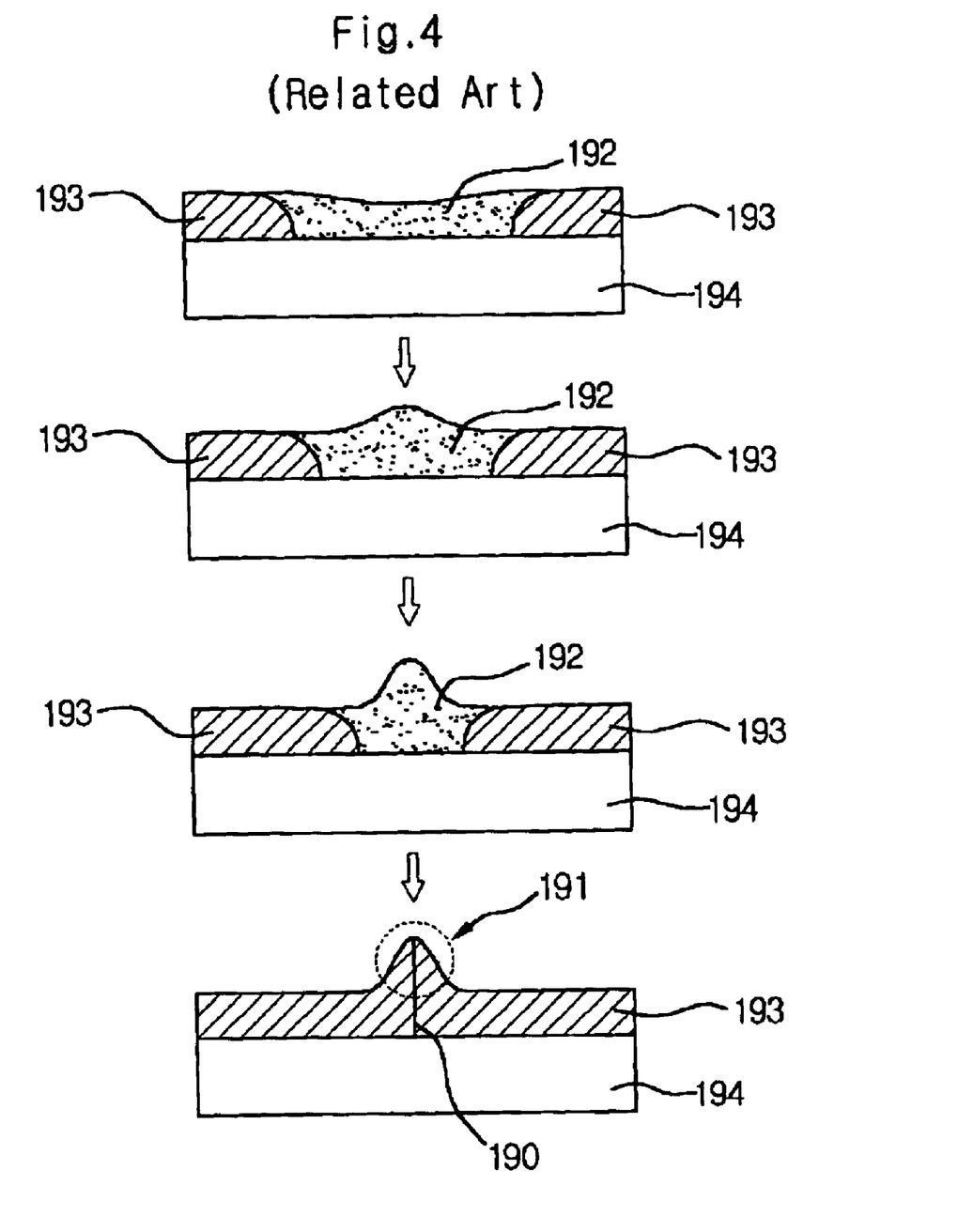
FIG. 4 is a schematic view illustrating a process in which a protruding portion forms at a grain boundary of a poly silicon layer in the course of the crystallization process when using the related art SLS technique.

FIG. 4 is a schematic view illustrating a process in which a protruding portion forms at a grain boundary in the course of a crystallization process when using the SLS technique. As shown in the drawing, liquefied silicon 192 that is melted by a laser beam transforms to solid silicon 193 during a lateral crystallization process. At this point, as a mass transfer occurs in a lateral direction, a protruding portion 191 is formed at a grain boundary 190. Since the density of liquefied silicon is greater than that of solid silicon by about 10% (density of liquefied silicon is 2.30 g/cm$^3$, and the density of solid silicon is 2.53 g/cm$^3$), the volume of liquefied silicon expands by 10% when it transforms into solid silicon.

Accordingly, when the grains are grown by the SLS technique, the mass transfer to the middle portion of the liquefied portion occurs, as the solid portion is grown. Furthermore, the finalized shape of the solid portion has the protruding portion 191 formed at the grain boundary 190. The protruding portion 191 causes the crystalline silicon layer to have a coarse surface, making it difficult to form a thin film transistor with a high electric charge mobility and thereby harming the reliability of the thin film transistor.

Furthermore, since some of the grain boundaries of the poly crystal silicon may function as a barrier for obstructing current flow, it is difficult to provide a reliable thin film transistor device. In addition, electrons may collide with each other at some of the grain boundaries generating a collision current, causing the insulating layer to deteriorate or even to break, resulting in an inferior device.

SUMMARY OF THE INVENTION

Accordingly, the present invention is directed to a method for crystallizing amorphous silicon that substantially obviate one or more problems due to limitations and disadvantages of the related art.

An advantage of the present invention is to provide a method for crystallizing amorphous silicon that can reduce the height of a protruding portion formed at a grain boundary of a poly-silicon layer in an sequential lateral solidification technique process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described herein, a method for crystallizing amorphous silicon may, for example, include preparing a substrate on which an amorphous silicon layer is formed; aligning a mask above the substrate, the mask being divided into first and second blocks, the first block having a plurality of first transmission slits and a plurality of interception portions formed between the first transmission slits, the second block having a plurality of second transmission slits alternately arranged with the first transmission slits and a plurality of third transmission slits formed corresponding to middle portions of the first transmission slits; forming first crystalline regions on the amorphous silicon layer by irradiating a laser beam through the first transmission slits, each of the first crystalline regions having a crystallized region and a nucleation region; and crystallizing non-crystalline regions between the first crystalline regions and re-crystallizing the nucleation regions by moving either or both of the substrate and the mask by a distance and by irradiating a laser beam through the second and third transmission slits.

According to another aspect of the present invention, a mask used for crystallizing an amorphous layer into a poly-crystal layer using a sequential lateral solidification technique may, for example, include first and second blocks patterned side by side, the first and second blocks having an identical size to each other, wherein the first block comprises a plurality of first transmission slits and a plurality of interception portions formed between the first transmission slits; and the second block comprises a plurality of second transmission slits alternately arranged with the first transmission slits and a plurality of third transmission slits formed corresponding to middle portions of the first transmission slits.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

In the drawings.

DETAILED DESCRIPTION OF THE ILLUSTRATED EMBODIMENTS

Reference will now be made in detail to the preferred embodiments of the present invention, examples of which are illustrated in the accompanying drawings.

In the present invention, a single scan technology is used for crystallizing a desired amorphous silicon layer using a SLS technique that utilizes a mask having N blocks, each of the N blocks having a predetermined distance and having an asymmetrical pattern of transmission regions.

Figure 5:
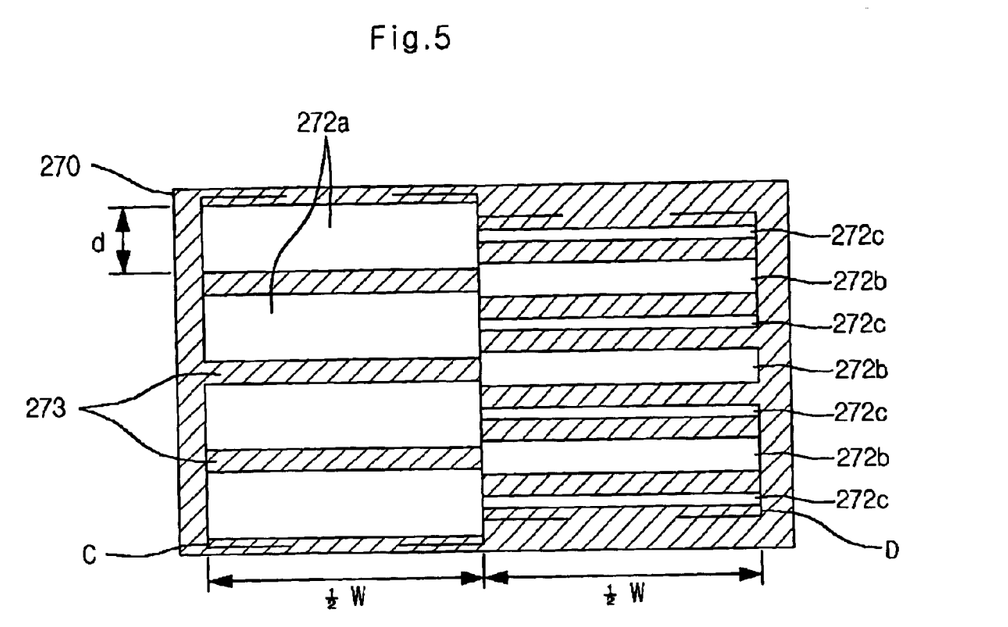
FIG. 5 is a schematic plane view illustrating a mask used for a method for crystallizing amorphous silicon according to a preferred embodiment of the present invention.

FIG. 5 shows a schematic plane view of a mask used in a method for crystallizing amorphous silicon according to a preferred embodiment of the present invention. As shown in the drawing, a mask 270 is provided with a plurality of transmission patterns 272a, 272b and 272c. In more detail, the mask 270 includes a first block C that has the first transmission slits 272a, which are formed to be spaced away from each other by a predetermined gap widthwise. The mask 270 further includes a second block D that has the second transmission slits 272b, which correspond to the gaps between the first transmission slits 272a (i.e., the second transmission slits 272b are alternately arranged with the first transmission slits 272a), and the third transmission slits 272c, which have a predetermined width and correspond to middle portions of the first transmission slits 272a.

Accordingly, when a stage (not shown) on which a substrate is disposed moves a distance of a half of the mask 270 (½ W) in a lengthwise direction, the second transmission slits 272b in the second block D of the mask 270 are to be located on the regions of the amorphous silicon layer, which correspond to the interception regions formed between the first transmission slits 272a in the first block C. In addition, the third transmission slits 272c in the second block D of the mask 270 are to be located at the middle portions of the first transmission slits 272a in the first block C.

In the present invention, a width d of the first transmission slits 272a in the first block C of the mask 270 is designed to be greater than twice as long as a maximum length of a grain grown by a stroke of laser beam irradiation. As a result, when first regions of the amorphous silicon layer, which correspond to the first transmission slits 272a in the first block C, are crystallized into a poly-silicon layer, nucleation regions in which small crystal grains are formed in the middle portions of the first regions of the amorphous silicon layer are formed. That is, since the width of the slits 272a is relatively large, a growth speed of the grains at a peripheral portion of the beam, where thermal discharge is quickly realized when the melted amorphous silicon layer is solidified, is faster than a nucleation speed at a central portion of the beam, thereby forming small grains at the middle portion of the first regions of the amorphous silicon layer.

As a result, when the crystallization is carried out using the mask 270 while moving the stage a lengthwise direction, the crystallization of the region can be completed by a stroke of the laser beam scan. In addition, in the course of the laser beam scan, the small crystal grains in the nucleation regions formed at the middle portion of the first regions of the amorphous silicon layer, which are crystallized in response to the first block C, can be selectively re-crystallized using the third transmission slits 272c in the second block D.

Figure 6A:
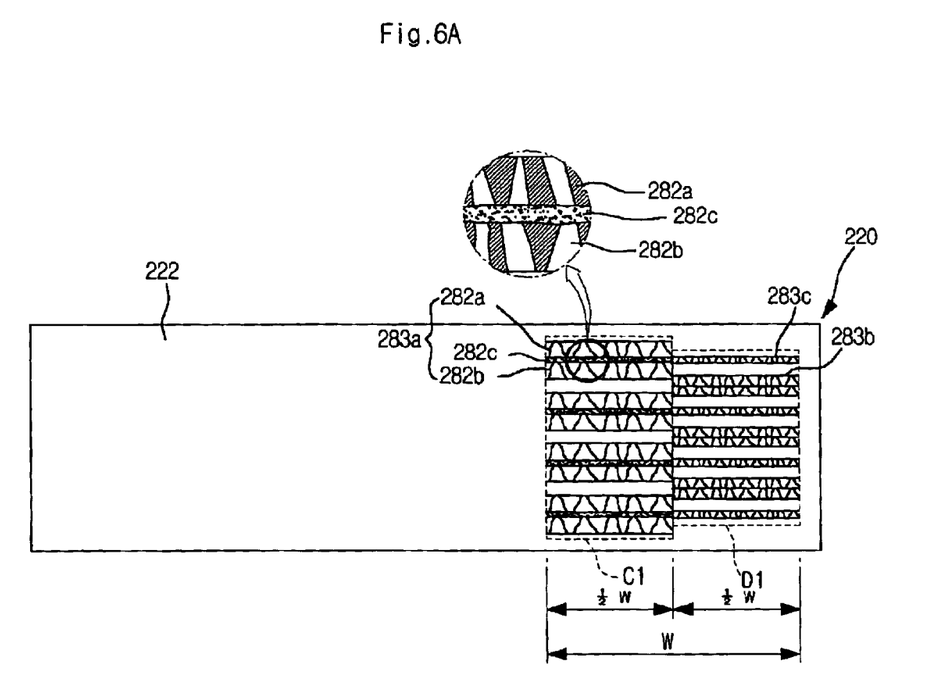
FIGS. 6A to 6E are sectional views illustrating sequential processes of a method for crystallizing amorphous silicon according to a preferred embodiment of the present invention.

A method for crystallizing amorphous silicon according to a preferred embodiment of the present invention will be described hereinafter with reference to FIGS. 6A to 6E that show sectional views of consecutive processes of the method. First, a buffer layer (not shown) that is an insulating layer is formed on a substrate 220, and an amorphous silicon layer 222 is deposited on the buffer layer. Next, the amorphous silicon layer 222 undergoes a heat treatment for dehydration. Afterwards, as shown in FIG. 6A, the mask illustrated in FIG. 5 is disposed above the substrate 220 having the amorphous silicon layer 222.

Then, a first laser beam irradiates the substrate 220. With the first laser beam irradiation, first regions of the amorphous silicon layer, which correspond to the first transmission slits. 272a in the first block C (see FIG. 5), form a first crystallized region 283a. That is, the first regions corresponding to the first transmission slits 272a of the mask 270 is crystallized in poly-silicon.

In more detail, the first regions are melted by the first laser beam, and as the temperature is lowered, the grains are grown from both boundaries of the melted regions. As a result, the first crystallized region 283a, which includes a first grain region 282a, a second grain region 282b, and a nucleation region 282c formed between the first and second grain regions 282a and 282b, is formed. In addition, second and third crystallized regions 283b and 283c are further formed on the amorphous silicon layer, corresponding to the second and third transmission slits 272b and 272c, respectively, in the second blocks D of the mask 270. The first crystallized regions 283a are formed in a first crystalline region group C1 corresponding to the first transmission slits 272a of the first block C of the mask 270, and the second and third crystallized regions 283b and 283c are formed in a second crystalline region group D1 corresponding to the second and third transmission slits 272b and 272c in the second block D.

At this point, the regions in the first crystalline region group C1, which are crystallized into a poly-silicon layer, are divided into the grain growth regions 282a and 282b, and the nucleation region 282c where the small poly-silicon crystal grains are formed. The nucleation region 282 is formed on a region corresponding to the first transmission slits 272a having a width that is designed to be greater than twice as long as the maximum growth length of the grain.

As described above, the nucleation region 282c is formed by the following reasons. As is well known, when a laser beam having an energy density in a complete melting regime irradiates an amorphous silicon layer, the regions applied with the laser beam are completely melted. After that, as the temperature is lowered, grains are grown at a boundary between the liquefied silicon and the solid silicon. At this point, regardless of the area of the melted region, the maximum growth length of the grains cannot be greater than a limited length. That is, although the maximum growth length of the grains is varied depending on the energy density of the laser beam and the temperature of the substrate, it has a uniform value under a predetermined condition. Accordingly, when the width of the melted region by the laser beam is greater than twice as long as the maximum growth length of the grains, the nucleation region 282c is formed between the grain regions 282a and 282b.

As a result, as shown in FIG. 6A, the first crystalline region group C1 including the first crystallized regions 283a and the second crystalline region group D1 including the second and third crystallized regions 283b and 283c are formed on the substrate 220. Here, the first crystalline region group C1 further includes the nucleation regions 282c, in which the small crystal grains are formed, in the first crystallized regions 283a.

Figure 6B:
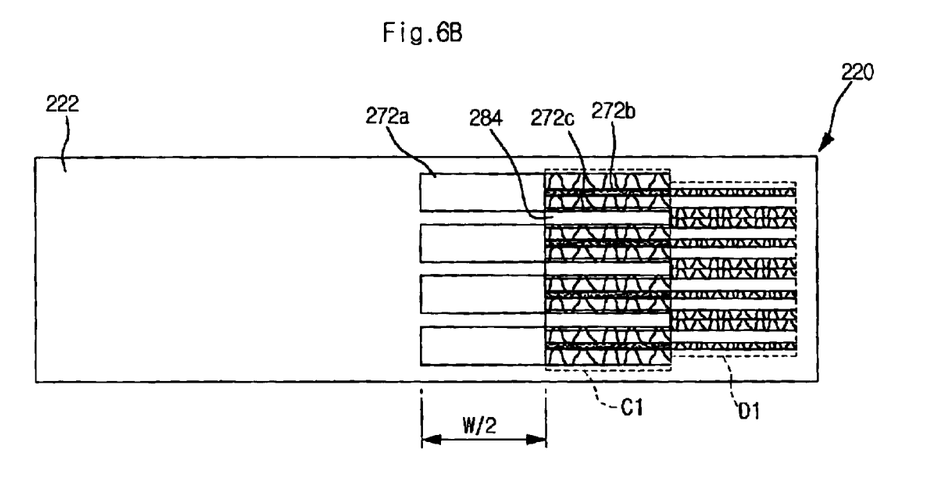

Next, as shown in FIG. 6B, when the first laser beam irradiation process is completed, an X-Y stage (not shown) on which the substrate 220 is disposed moves in a lengthwise direction. The present invention is not limited to this. The mask can be displaced instead of the X-Y stage, or the mask and the X-Y stage can be simultaneously displaced. As the stage moves in a lengthwise direction by a length (W/2) of the transmission pattern in the first block C, the first transmission slits 272a in the first block C of the mask are located corresponding to a new amorphous silicon layer 222. In addition, the second block D is located corresponding to the first crystalline region group C1 formed by the first laser beam irradiation. At this point, the second and third transmission slits 272b and 272c in the second block D are located above non-crystalline regions 284 between the first crystallized regions 283a and the middle portions of the first crystallized regions 283a.

Figure 6C:
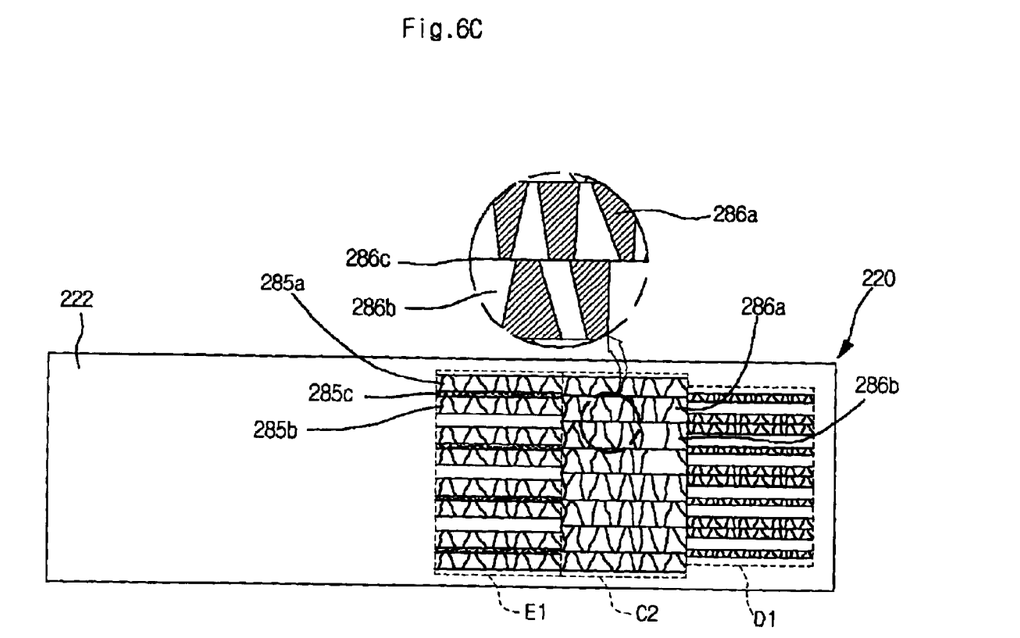

Afterwards, a second laser beam is directed onto the mask 270. With the second laser beam irradiation, the first crystalline region group C1 receives the laser beam again. At this point, the non-crystalline region 284 and the nucleation region 282c are simultaneously crystallized. As described above, the second transmission slits 272c in the second block D of the mask 270 overlap the entire portion of the nucleation region 282c and also slightly overlap the grain regions 282a and 282b. With the second laser beam irradiation, a complete crystallized region C2 having high quality grains can be obtained, as shown in FIG. 6C.

Meanwhile, since the stage is displaced lengthwise by a length (W/2) of the transmission pattern in the first block C, a third crystalline region group E1 is formed on the substrate 220, corresponding to the transmission slits 272a in the first block of the mask 270. The third crystalline region group E1 includes grains 285a and 285b that are grown to a maximum value and an nucleation region 285c in which small crystal grains are formed without the grain growth.

When the nucleation regions 282c in the complete crystallized region C2 is completely melted by the second laser beam, the grains further grow towards the nucleation region 282c. Accordingly, the second laser beam removes the nucleation regions 282c by re-crystallizing them, thereby minimizing the protruding portions at the grain boundaries, which may be formed by the re-crystallization. This will be described in more detail with reference to FIG. 7 hereinbelow.

In addition, with the second laser beam irradiation, the grains further grow from the first crystallized region 283a to the non-crystalline region 284. As a result, bigger grains 286a and 286b are formed, while forming a new grain boundary 286c. Accordingly, as shown in the drawing, the complete crystallized region C2 and the third crystalline region group E1 that is partially crystallized by the second laser beam irradiation are formed.

Figure 6D:
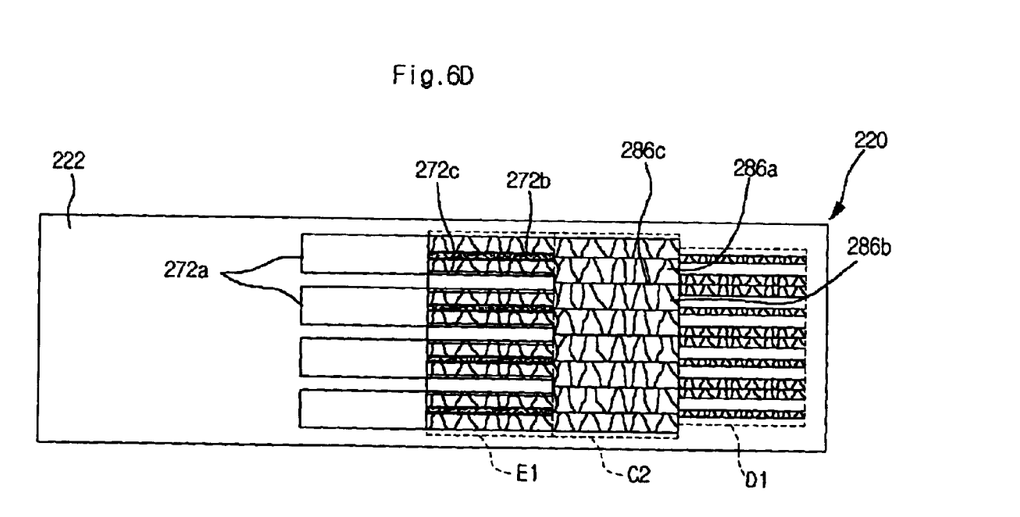
Figure 6E:
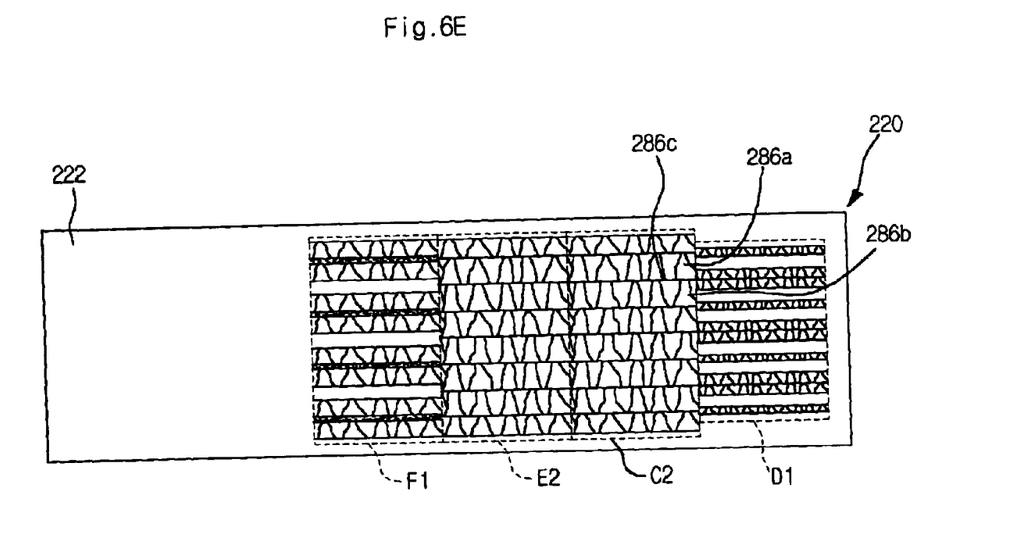

Afterwards, as shown in FIG. 6D, the stage further moves by a length (W/2) of the first transmission slits 272a in the first block C of the mask 270 and a third laser beam is irradiated. As a result, a crystalline region E2 is formed extending from the complete crystallized region C2, as shown in FIG. 6E. In addition, a new crystalline region group F1 is formed corresponding to the transmission pattern in the first block.

Using the above described mask, when the processes described in FIGS. 6A to 6E are repeated, a high quality poly-silicon layer having a protruding portion of reduced height can be obtained quickly on a large area.

Figure 7:
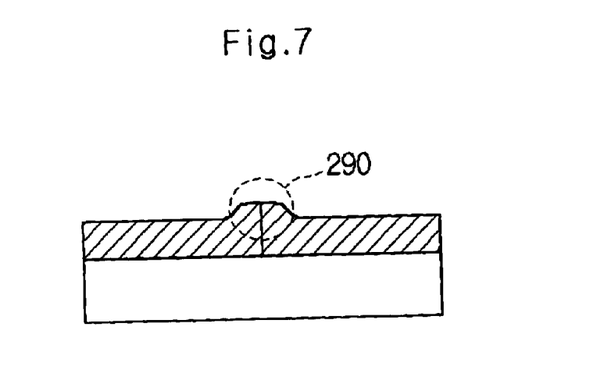
FIG. 7 is a view illustrating a protruding portion formed at a grain boundary of a poly silicon layer by a method for crystallizing amorphous silicon according to a preferred embodiment of the present invention.

FIG. 7 shows a protruding portion formed at the grain boundary of the poly-silicon layer by the silicon crystallization method of the present invention. As described above, the height (roughness) of the protruding portion 290 at the grain boundary is reduced by an activation process using a mask transmission pattern of the present invention.

Figure 8:
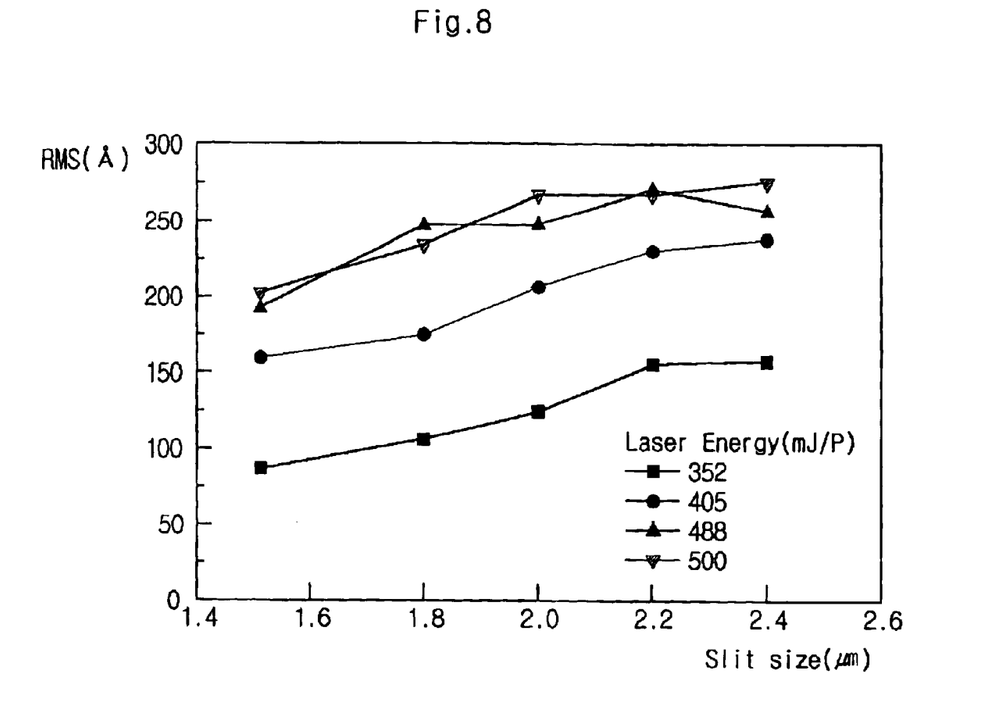
FIG. 8 is a view illustrating a root mean square (RMS) roughness of a protruding portion formed at a grain boundary of a poly silicon layer depending on a distance between mask slits.

Meanwhile, FIG. 8 shows a root mean square (RMS) roughness of a protruding portion formed at a grain boundary of a poly-silicon layer depending on a distance between mask slits. Generally, as shown in FIG. 8, there is a tendency that the greater the gap between the slits of the mask, the higher the protruding portion at the grain boundary. When the gap between the slits is designed to be small, the roughness at the grain boundary is reduced. Therefore, the width of the slits in the second block should be as small as possible according to the present invention. The minimum value of the width is greater than a minimum value allowed by an optical system used. Also, the slits in the second block used for the re-crystallization are designed to include all of the nucleation region in the crystallized region formed by the transmission slits in the first block.

When the crystallization process of the present invention is carried out as described above, a large-size amorphous silicon layer can be quickly crystallized into the crystalline silicon layer having grains grown to the maximum value by simply moving the X-Y stage in a widthwise direction.

Meanwhile, to improve resolution of LCDs, the pad pitch of signal and scanning lines should be shortened. However, when the pad pitch is shortened, it is difficult to carry out the bonding of driver circuits when using a conventional tape carrier packaging (TCP) process. However, when the driver circuits are directly formed on the substrate by use of a poly silicon layer, the packaging process can be simplified and the costs for the driving ICs can be reduced.

The driver circuits usually include a complementary metal oxide semiconductor (CMOS) device, which is driven by an inverter and is comprised of an N-type transistor and a P-type transistor that are coupled to each other. As the CMOS device has an advantage of extremely low power consumption, it is generally used as a driving device constituting the driver circuits. The CMOS device requires fast performance characteristics. Therefore, when a poly-silicon layer formed by the above-described silicon crystallizing method of the present invention is used to form the active layer of the CMOS device and the switching device of a liquid crystal panel, high mobility can be obtained, thereby improving the definition of the liquid crystal panel.

As described above, the present inventive method for crystallizing amorphous silicon using the SLS technique provides a high quality poly-silicon layer having an improved roughness (flatness) characteristics, which is made possible by (a) dividing a mask into first and second blocks, (b) forming a nucleation region using wide slits formed in the first block, and (c) reducing the height of a protruding portion at a grain boundary by re-crystallizing the nucleation region narrow slits formed in the second block.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for crystallizing amorphous silicon, the method comprising:
    preparing a substrate on which an amorphous silicon layer is formed;
    aligning a mask above the substrate, the mask being divided into first and second blocks, the first block having a plurality of first transmission slits and a plurality of interception portions formed between the first transmission slits, the second block having a plurality of second transmission slits alternately arranged with the first transmission slits and a plurality of third transmission slits formed corresponding to middle portions of the first transmission slits;
    forming first crystalline regions on the amorphous silicon layer by irradiating a laser beam through the first transmission slits, each of the first crystalline regions having a crystallized region and a nucleation region; and
    crystallizing non-crystalline regions between the first crystalline regions and re-crystallizing the nucleation regions by moving either or both of the substrate and the mask by a distance and by irradiating a laser beam through the second and third transmission slits.

2. The method according to claim 1, wherein the substrate is displaced by a stage on which the substrate is disposed, and a stroke of displacement of the stage is half a length of the mask.

3. The method according to claim 1, wherein a width of the first transmission slits in the first block is greater than twice as long as a maximum length of a grain grown without forming the nucleation regions on the amorphous silicon layer by irradiating the laser beam.

4. The method according to claim 1, wherein a width of the first transmission slits in the first block is greater than twice as long as a maximum length of a grain grown on the amorphous silicon layer by irradiating the laser beam.

5. The method according to claim 1, wherein a width of the third transmission slits in the second block is greater than that of the nucleation region of the first crystalline region.

6. The method according to claim 1, wherein a width of the second transmission slits in the second block is greater than that of the non-crystalline region corresponding to an interception portion between the first transmission slits.

7. The method according to claim 1, wherein a width of the first transmission slits is greater than an interception portion formed between the first transmission slits.

8. The method according to claim 1, wherein a width of the first transmission slits is greater than that of the second transmission slits, and the width of the second transmission slits is greater than that of the third transmission slits.

9. The method according to claim 1, wherein an entire surface of the mask receives uniform energy of the laser beam.

10. The method according to claim 1, wherein in the step of moving either or both of the substrate and the mask, the second block is located at the previous location of the first block.

11. A mask used for crystallizing an amorphous layer into a poly-crystal layer using a sequential lateral solidification technique, the mask comprising:
    first and second blocks patterned side by side, the first and second blocks having an identical size to each other,
    wherein the first block comprises a plurality of first transmission slits and a plurality of interception portions formed between the first transmission slits; and
    the second block comprises a plurality of second transmission slits alternately arranged with the first transmission slits and a plurality of third transmission slits formed corresponding to middle portions of the first transmission slits.

12. The mask according to claim 11, wherein a width of the first transmission slits is greater than twice as long as a maximum length of a grain grown without forming the nucleation regions on the amorphous silicon layer by irradiating the laser beam.

13. The mask according to claim 11, wherein a width of the first transmission slits in the first block is greater than twice as long as a maximum length of a grain grown on the amorphous silicon layer by irradiating the laser beam.

14. The mask according to claim 11, wherein a width of the third transmission slits is greater than that of the nucleation region formed in a crystalline region on which the laser beam is irradiated through the first transmission slits.

15. The mask according to claim 11, wherein a width of the second transmission slits is greater than that of the non-crystalline region corresponding to the interception portion between the first transmission slits.

16. The mask according to claim 11, wherein a width of the first transmission slits is greater than the interception portion formed between the first transmission slits.

17. The mask according to claim 11, wherein a width of the first transmission slits is greater than that of the second transmission slits, and the width of the second transmission slits is greater than that of the third transmission slits.

18. A thin film transistor comprising a poly-crystal silicon layer formed through a method for crystallizing amorphous silicon, the method comprising:

aligning a mask above a substrate on which an amorphous silicon layer is formed, the mask being divided into first and second blocks, the first block having a plurality of first transmission slits and a plurality of interception portions formed between the first transmission slits, the second block having a plurality of second transmission slits alternately arranged with the first transmission slits and a plurality of third transmission slits formed corresponding to middle portions of the first transmission slits;

forming first crystalline regions on the amorphous silicon layer by irradiating a laser beam through the first transmission slits, each of the first crystalline regions having a crystallized region and a nucleation region; and crystallizing non-crystalline regions between the first crystalline regions and re-crystallizing the nucleation regions by moving either or both of the substrate and the mask by a distance and by irradiating a laser beam through the second and third transmission slits.

19. The thin film transistor according to claim 18, wherein a width of the first transmission slits in the first block is greater than twice as long as a maximum length of a grain grown without forming the nucleation regions on the amorphous silicon layer by irradiating the laser beam.

20. The thin film transistor according to claim 18, wherein a width of the first transmission slits in the first block is greater than twice as long as a maximum length of a grain grown on the amorphous silicon layer by irradiating the laser beam.

21. The thin film transistor according to claim 18, wherein a width of the third transmission slits in the second block is greater than that of the nucleation region of the first crystalline region.

22. The thin film transistor according to claim 18, wherein a width of the second transmission slits in the second block is greater than that of the non-crystalline region corresponding to the interception portion between the first transmission slits.

23. The thin film transistor according to claim 18, wherein a width of the first transmission slits is greater than the interception portion formed between the first transmission slits.

24. The thin film transistor according to claim 18, wherein a width of the first transmission slits is greater than that of the second transmission slits, and the width of the second transmission slits is greater than that of the third transmission slits.

25. A method for making a poly-crystal layer, the method comprising:

forming first crystalline regions on the amorphous layer by irradiating a laser beam through a plurality of first transmission slits, each of the first crystalline regions having a crystallized region and a nucleation region;

crystallizing non-crystalline regions between the first crystalline regions by irradiating the laser beam through a plurality of second transmission slits; and re-crystallizing the nucleation regions formed in the first crystalline regions by irradiating the laser beam through a plurality of third transmission slits.

26. The method according to claim 25, wherein a width of the first transmission slits is greater than twice as long as a maximum length of a grain grown without forming the nucleation regions on the amorphous layer by irradiating the laser beam.

27. The method according to claim 25, wherein a width of the first transmission slits is greater than twice as long as a maximum length of a grain grown on the amorphous layer by irradiating the laser beam.

28. The method according to claim 25, wherein a width of the second transmission slits is greater than that of the non-crystalline region between the first crystalline regions, but is limited to an extent where the grain can be grown without forming the nucleation regions in the amorphous layer by irradiating the laser beam.

29. The method according to claim 25, wherein a width of the third transmission slits is greater than that of the nucleation region of the first crystalline region, but is limited to an extent where the grain can be grown without forming the nucleation regions in the amorphous layer by irradiating the laser beam.

* * * * *